United States Patent
Takahashi

(10) Patent No.: US 6,792,022 B2
(45) Date of Patent: Sep. 14, 2004

(54) SEMICONDUCTOR LASER, METHOD OF PRODUCING THE SAME AND EVANESCENT OPTICAL HEAD USING THE SAME

(75) Inventor: Makoto Takahashi, Tokyo (JP)

(73) Assignee: TDK Corporation, Tokyo (JP)

( * ) Notice: Subject to any disclaimer, the term of this patent is extended or adjusted under 35 U.S.C. 154(b) by 59 days.

(21) Appl. No.: 10/039,490

(22) Filed: Oct. 26, 2001

(65) Prior Publication Data

US 2002/0105987 A1 Aug. 8, 2002

(30) Foreign Application Priority Data

Oct. 27, 2000 (JP) ........................................ 2000-328771

(51) Int. Cl.⁷ ................................................ H01S 5/00
(52) U.S. Cl. .............................. 372/49; 372/29; 372/32
(58) Field of Search ...................................... 372/44, 32

(56) References Cited

U.S. PATENT DOCUMENTS

| | | | | |
|---|---|---|---|---|
| 4,280,107 A | * | 7/1981 | Scifres et al. ................... 372/99 |
| 4,852,112 A | * | 7/1989 | Kagawa et al. ................ 372/49 |
| 5,548,137 A | * | 8/1996 | Fan et al. ..................... 257/191 |
| 5,573,976 A | * | 11/1996 | Kato et al. ..................... 438/42 |
| 5,625,617 A | * | 4/1997 | Hopkins et al. ............. 369/121 |
| 5,960,019 A | * | 9/1999 | Hayashi et al. ................ 372/46 |
| 5,998,068 A | * | 12/1999 | Matsuoka ....................... 430/5 |
| 6,240,235 B1 | * | 5/2001 | Uno et al. ................... 385/137 |
| 6,324,149 B1 | * | 11/2001 | Mifune et al. .......... 369/112.01 |
| 6,411,636 B1 | * | 6/2002 | Ota et al. ...................... 372/43 |
| 2002/0018501 A1 | * | 2/2002 | Hatakoshi et al. ............. 372/43 |

FOREIGN PATENT DOCUMENTS

JP 09-145603 6/1997

* cited by examiner

*Primary Examiner*—Don Wong
*Assistant Examiner*—Dung (Michael) T Nguyen
(74) *Attorney, Agent, or Firm*—Brown Raysman Millstein Felder & Steiner LLP

(57) ABSTRACT

A semiconductor laser for emitting evanescent light that has a laser beam-emitting facet including a light-emitting region is constituted to comprise a three-dimensional feature portion formed on the laser beam-emitting end facet, a light-shielding film covering at least the light-emitting region, and a small opening for emitting the evanescent light formed in the light-shielding film at a location to have a prescribed positional relationship with the three-dimensional feature portion. The presence of the three-dimensional feature portion enables the small opening to be formed precisely with respect to the light-emitting region by a simple operation.

12 Claims, 13 Drawing Sheets

DIRECTION OF ROTATION

SEMICONDUCTOR LASER, METHOD OF PRODUCING THE SAME AND EVANESCENT OPTICAL HEAD USING THE SAME

FIELD

The present invention relates to a semiconductor laser, a method of producing the semiconductor laser and an evanescent optical head using the semiconductor laser, particularly to a semiconductor laser that can be easily formed with a small opening for emitting evanescent light, a method of producing the semiconductor laser and an evanescent optical head using the semiconductor laser.

BACKGROUND OF THE INVENTION

Recent advances in telecommunications technology are increasing demand for higher capacity data recording media such as optical disks. One key to achieving high-capacity optical disks and other data recording media is to increase recording density by reducing the spot diameter of the laser used for reading and writing data from/to the medium. Many attempts have been made to reduce spot diameter by shortening the wavelength or increasing the numerical aperture (NA) of the laser beam source.

Separately from these attempts focused on shortening the wavelength or increasing the numerical aperture (NA) of the laser beam source, another approach has been pursued based on use of evanescent light for reading and writing data from/to optical disks and other such media, as taught, for example, by Japanese Patent Application Laid-Open No. 9-145603. Evanescent light, also called "near-field light," is produced when light passes through a small opening of a diameter considerably smaller than the wavelength of the light source. This is known as one way of obtaining evanescent light. When evanescent light is used for read/write of optical disks and other media, the laser spot diameter can be reduced substantially independently of the laser beam source wavelength. This means that use of evanescent light for read/write of optical disks and the like has the potential to enhance the recording density of such data recording media and thus increase their recording capacity.

When a semiconductor laser is used to produce evanescent light, substantially the total area of the light-emitting end face of the semiconductor laser, including the light-emitting region from which the laser beam actually exits, is first formed with a light-shielding film and then part of the portion of the light-shielding shield film over the light-emitting region is removed to form a small opening. As this enables emission of evanescent light from the small opening, use of the semiconductor laser in a head for read/write of an optical disk or the like makes it possible to increase the recording capacity of the recording medium.

When evanescent light is to be obtained using a semiconductor laser, therefore, the light-shielding film formed on the light-emitting end face of the semiconductor laser has to be removed at one part of the portion corresponding to the light-emitting region. However, the location of the portion of the light-shielding film corresponding to the light-emitting region is extremely difficult to determine. This is because once the light-shielding film has been formed on the light-emitting end face of the semiconductor laser, the layer structure of the semiconductor laser can no longer be visually ascertained and there is no way of visually determining what portion of the light-shielding film formed on the light-emitting end face of the semiconductor laser corresponds to the light-emitting region.

Conventionally, therefore, an operation has been required for determining the point at which the small opening should be formed by in advance measuring the distance of the light-emitting region from external features of the semiconductor laser such as projections occurring on the upper and lower faces lying perpendicular to the light-emitting end face. Since the size of the light-emitting region is much smaller than the outer dimensions of the semiconductor laser, however, it is hard to form the small opening at exactly the right location by this kind of operation. Ascertaining the location at which the small opening should be formed is particularly difficult when the semiconductor laser has no distinctive external features, such as when the upper, lower and lateral surfaces are all flat.

SUMMARY OF THE INVENTION

It is therefore an object of the present invention to provide a semiconductor laser that can be easily formed with a small opening for emitting evanescent light and a method of producing the semiconductor laser.

Another object of the present invention is to provide an evanescent optical head equipped with a semiconductor laser that can be easily formed with a small opening for emitting evanescent light.

In one aspect of the present invention, the above and other objects are accomplished by a semiconductor laser having a laser beam-emitting end facet including a laser beam-emitting region, the semiconductor laser comprising a three-dimensional feature portion indicating the location of the light-emitting region formed on the laser beam-emitting facet at a region different from the light-emitting region.

In this aspect of the present invention, since the three-dimensional feature portion indicating the location of the light-emitting region is formed on the laser beam-emitting facet at a region different from the light-emitting region, the location of the light emitting region can be ascertained by referring to the three-dimensional feature portion.

In a preferred embodiment of the present invention, the three-dimensional feature portion is at least one of a concavity and a convexity formed on the laser beam-emitting facet at a region different from the light-emitting region.

In another preferred embodiment of the present invention, the semiconductor laser further comprises a light-shielding film covering at least the light-emitting region, the light-shielding film being formed with a small opening at part of the portion over the light-emitting region.

In this preferred embodiment, the location of the light-emitting region can be ascertained by referring to the three-dimensional feature portion even after the light-emitting region has been covered by the light-shielding film. The location at which the small opening should be formed can therefore be determined accurately and simply.

In another preferred embodiment of the present invention, the light-shielding film further covers the three-dimensional feature portion.

In this preferred embodiment, the portion of the light-shielding film covering the three-dimensional feature portion reflects the three-dimensional feature. The location at which the small opening should be formed can therefore be determined accurately and simply by referring to this portion.

In another preferred embodiment of the present invention, the semiconductor laser further comprises a dielectric film provided between the laser beam-emitting facet and the light-shielding film, part of the dielectric film being exposed at the small opening.

In another aspect of the present invention, the above and other objects are accomplished by a method of producing a semiconductor laser having a laser beam-emitting facet including a laser beam-emitting region comprising a step of forming a three-dimensional feature portion at a location on the laser beam-emitting facet to have a prescribed positional relationship with the light-emitting region.

In this aspect of the present invention, since the three-dimensional feature portion is formed at a location on the laser beam-emitting facet to have a prescribed positional relationship with the light-emitting region, the location of the light-emitting region can be ascertained by referring to the three-dimensional feature portion.

In another preferred embodiment of the present invention, the method further comprises a step of forming a light-shielding film covering at least the light-emitting region and a step of forming the light-shielding film with a small opening at a location to have a prescribed positional relationship with the three-dimensional feature portion.

In this preferred embodiment, the location at which the small opening should be formed can be accurately and simply determined by referring to the three-dimensional feature portion even after the light-emitting region has been covered by the light-shielding film.

In another preferred embodiment of the present invention, the step of forming the three-dimensional feature portion and the step of forming the small opening both utilize focused ion beam (FIB) processing.

In this preferred embodiment, no special equipment is required for forming the three-dimensional feature portion because the two steps utilize FIB processing. Increase in semiconductor laser production cost can therefore be minimized.

In another preferred embodiment of the present invention, the method further comprises a step of irradiating at least the light-emitting region of the laser beam-emitting facet with an FIB before the step of forming the three-dimensional feature portion.

In this preferred embodiment, since the light-emitting region is irradiated with FIB before the step for forming the three-dimensional feature portion, the layer structure of the laser beam-emitting facet can be visually ascertained and, in addition, oxide film formed on the light-emitting region and impurities adhering to the light-emitting region can be removed.

In another aspect of the present invention, the above and other objects are accomplished by an evanescent optical head for reading/writing of data from/to a recording medium using evanescent light, the evanescent optical head being equipped with a semiconductor laser for emitting the evanescent light that comprises a laser beam-emitting facet including a light-emitting region, a three-dimensional feature portion formed on the laser beam-emitting facet, a light-shielding film covering at least the light-emitting region, and a small opening for emitting the evanescent light formed in the light-shielding film at a location to have a prescribed positional relationship with the three-dimensional feature portion.

DESCRIPTION OF THE PREFERRED EMBODIMENTS

Preferred embodiments of the present invention will now be explained with reference to the drawings.

Figure 1:
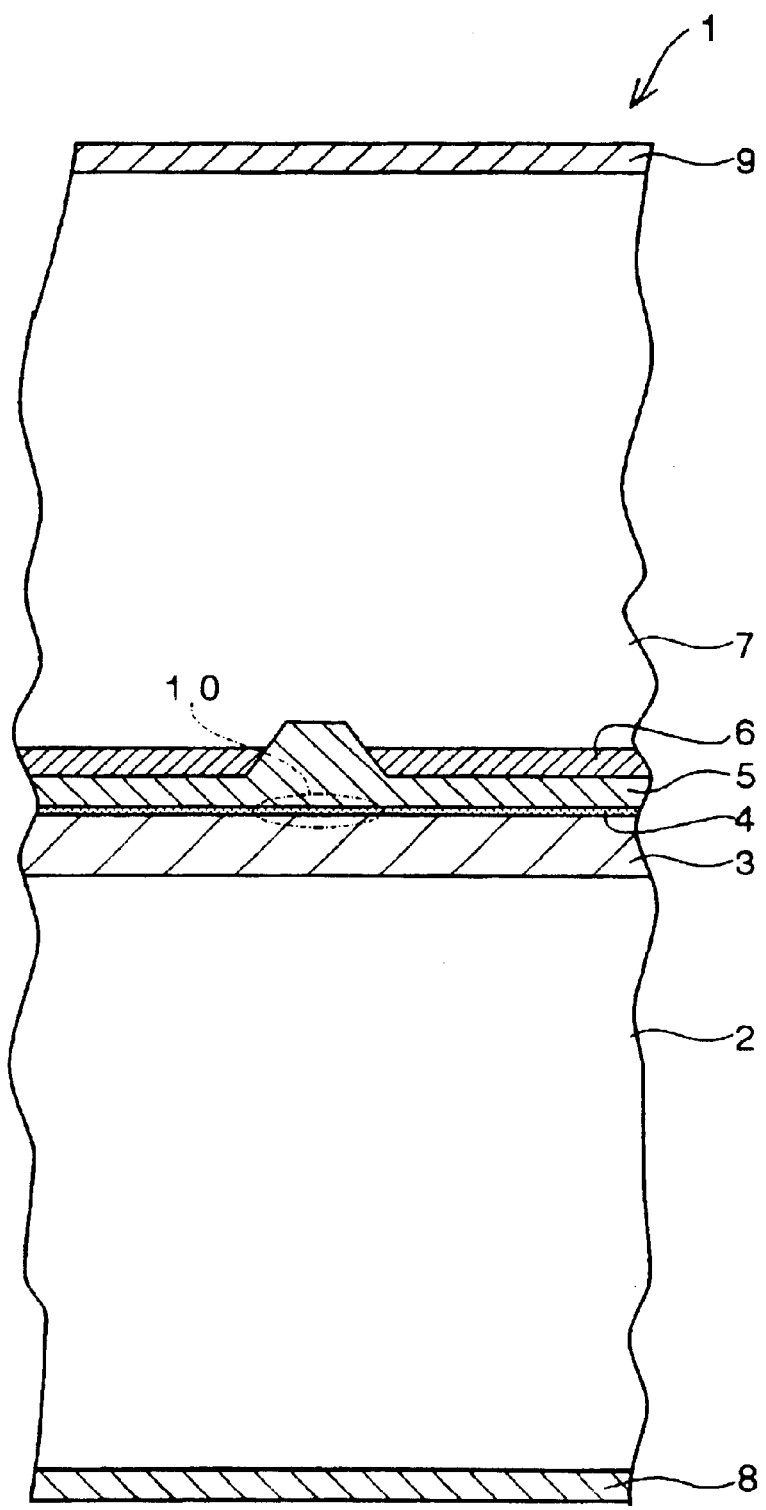
FIG. 1 is a simplified plan view of a semiconductor laser 1 that is a preferred embodiment the present invention viewed from the side of the laser beam-emitting facet.

FIG. 1 is a simplified plan view of a semiconductor laser 1 that is a preferred embodiment of the present invention viewed from the side of the laser beam-emitting facet. The semiconductor laser 1 is shown in FIG. 1 in its state prior to formation of a light-shielding film, small opening and other features as described in detail in the following.

As shown in FIG. 1, the semiconductor laser 1 of this embodiment comprises an n-GaAs substrate 2 having formed thereon in order an n-AlGaAs clad layer 3, an AlGaAs active layer 4, a p-AlGaAs clad layer 5, and n-GaAs current blocking layer 6 and a p-GaAs contact layer 7. The semiconductor laser 1 is further provided on the undersurface of the n-GaAs substrate 2 with a negative electrode 8 and on the upper surface of the p-GaAs contact layer 7 with a positive electrode 9. When a voltage is applied across the negative electrode 8 and the positive electrode 9 to pass electric current from the electrodes into the semiconductor laser 1, a laser beam is emitted from a light-emitting region 10 of the AlGaAs active layer 4. The AlGaAs active layer 4 has a thickness of around 0.1 $\mu$m and the portion of the AlGaAs active layer 4 constituting the light-emitting region 10 has a width of around 4 $\mu$m, although they are not limited to these values. The overall thickness of the semiconductor laser 1 is around 100 $\mu$m and the width thereof is around 200 $\mu$m, although it is not limited to these values. The wavelength of the laser beam emitted from the light-emitting region 10 is around 780 nm, although it is not limited to this value.

Figure 2:
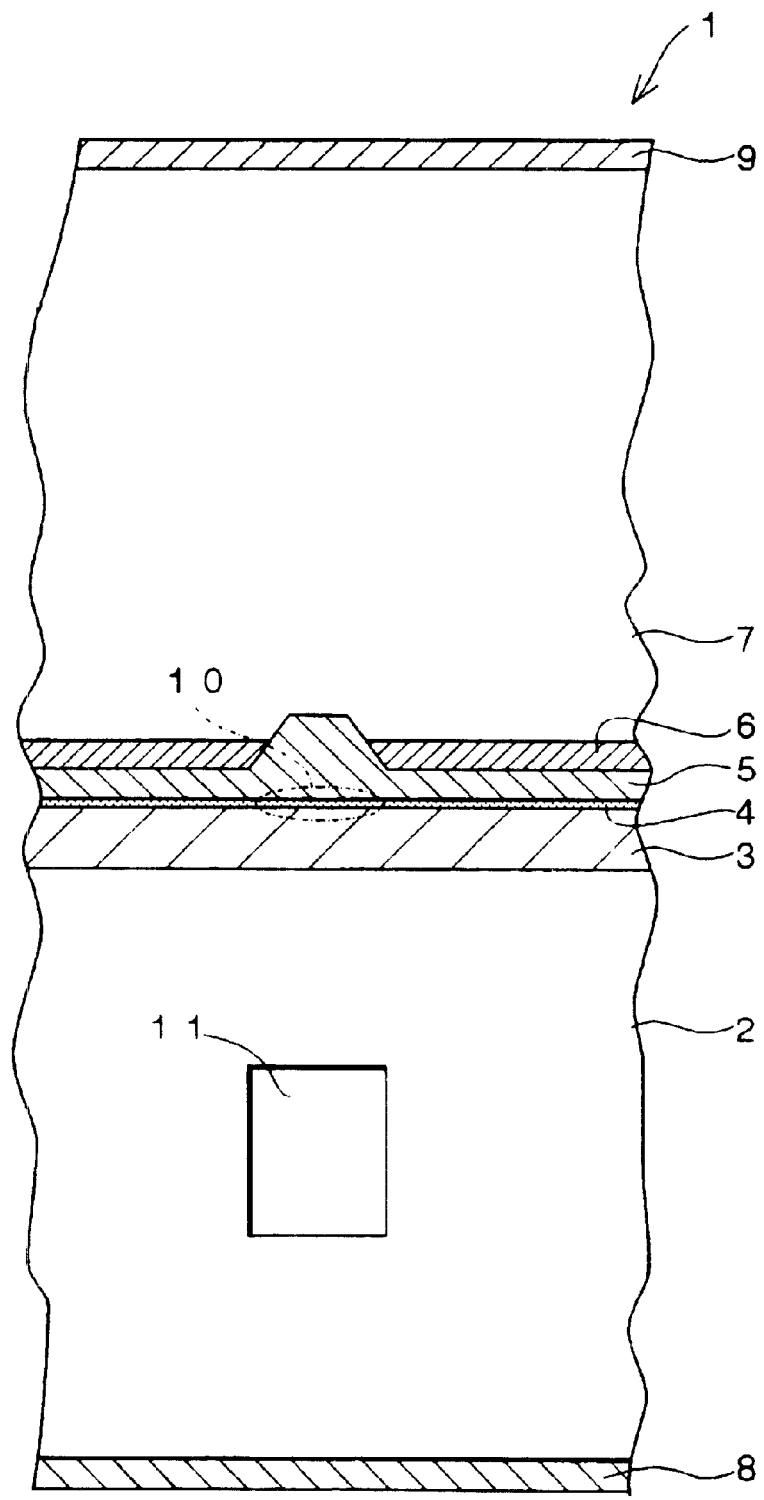
FIG. 2 is a simplified plan view of the semiconductor laser 1 viewed from the side of the laser beam-emitting facet in a state with a concavity 11 formed in an n-GaAs substrate 2.

In this embodiment, the semiconductor laser 1 of this configuration is first formed at a prescribed location, as is discussed below, of the n-GaAs substrate 2 with a concavity 11, as shown in FIG. 2.

FIG. 2 is a simplified plan view of the semiconductor laser 1 viewed from the side of the laser beam-emitting facet in a state with the concavity 1 formed in the n-GaAs substrate 2.

As shown in FIG. 2, the shape of the concavity 11 is rectangular. It has a width of about 4 μm, a height of about 5 μm and a depth of about 1 μm. The width of the concavity 11 is substantially equal to the width of the light-emitting region 10. The location at which the concavity 11 is formed is determined in relation to the light-emitting region 10. In this embodiment, the distance between the edge of the concavity 11 and edge of the light-emitting region 10 is set at about 12.4 μm. The locations of the light-emitting region 10 and the concavity 11 are defined to coincide in the lateral direction, such that the width of the light-emitting region 10 is substantially equal to that of the concavity 11 and the side ends of the light-emitting region 10 are coincident with the corresponding side ends of the concavity 11. It should be noted, however, that the foregoing specific numerical values are merely examples and the present invention is not limited to these specific numerical values.

The concavity 11 is formed in the following manner.

Of the entire laser beam-emitting facet of the semiconductor laser 1 in the state shown in FIG. 1, a relatively extensive region including the light-emitting region 10 is irradiated with a focused ion beam (FIB) to ascertain the location of the light-emitting region 10. Specifically, when the laser beam-emitting facet of the semiconductor laser 1 is scanned with the FIB, the laser beam-emitting facet emits secondary electrons whose observation makes it possible to visually ascertain the layer structure of the laser beam-emitting facet of the semiconductor laser 1 and, by this, to ascertain the location of the light-emitting region 10. As the purpose of the FIB irradiation is to ascertain the location of the light-emitting region 10, the energy density of the FIB can be set low and is preferably set at not greater than 0.2 pA/μm². Gallium ions are used as the ions of the FIB. The FIB irradiation slightly erodes the laser beam-emitting facet of the semiconductor laser 1.

Next, a FIB is directed onto a location apart from the location of the ascertained light-emitting region 10 by a predefined distance in a predefined direction. In this embodiment, it is directed onto a prescribed region located approximately 12.4 μm away from the light-emitting region 10 in the direction of the n-GaAs substrate 2, more specifically onto a region enclosed by an approximately 4 μm×5 μm rectangle. At this time, the energy density of the FIB is set higher than that of the FIB used to ascertain the location of the light-emitting region 10 so that the region is thoroughly eroded to form the concavity 11 to a depth of around 1 μm. Specifically, the energy density of the FIB is preferably set at about 10–20 pA/μm², more preferably about 15 pA/μm².

The location where the concavity 11 is to be formed can be determined either manually or automatically. In the manual mode, after the location of the light-emitting region 10 has been ascertained by the first FIB irradiation, the FIB device is manipulated by a human operator to direct the FIB for the second irradiation onto the location apart from the location of the light-emitting region 10 by the predefined distance in the predefined direction. In the automatic mode, an image of the layer structure of the semiconductor laser 1 visualized by the first FIB irradiation is captured and input to a computer where it is processed using a prescribed program to determine the location that should be subjected to the second FIB irradiation. When the location for forming the concavity 11 is automatically determined, data regarding the location where the concavity 11 is to be formed, the shape of the concavity 11 and the like must be supplied to the computer beforehand.

As a result of the foregoing operations, the concavity 11 is formed in the n-GaAs substrate 2 to have a prescribed positional relationship with the light-emitting region 10.

Figure 3:
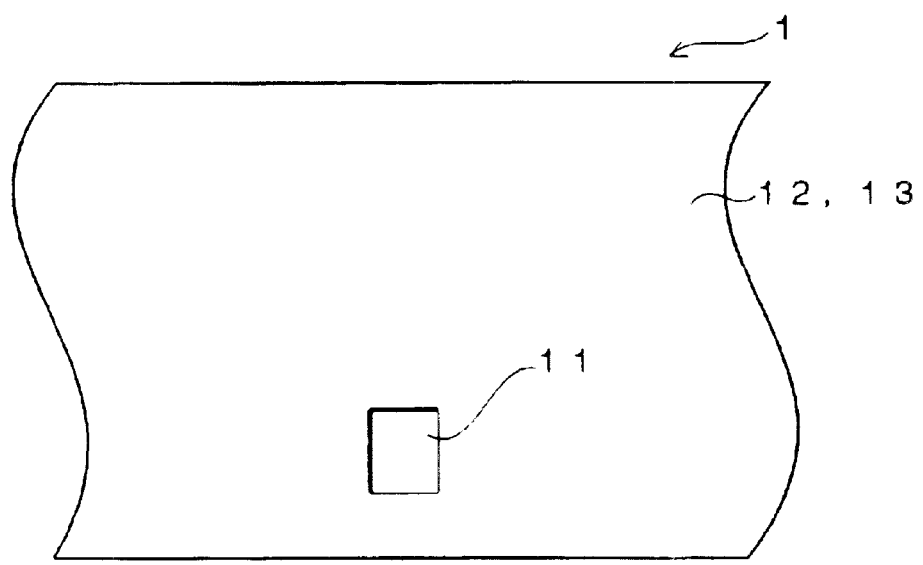
FIG. 3 is a simplified plan view of the semiconductor laser 1 viewed from the side of the laser beam-emitting facet in a state formed with a dielectric film 12 and a light-shielding film 13.

Next, and with reference to FIG. 3, substantially the total area of the laser beam-emitting facet of the semiconductor laser 1 formed with the concavity 11 is formed with a dielectric film 12 and a light-shielding film 13 in that order.

The dielectric film 12 can be an approximately 235 nm-thick silicon oxide ($SiO_2$) film and the light-shielding film 13 can be a laminate of approximately 50 nm-thick titanium (Ti) and approximately 200 nm-thick gold (Au), although the invention is not limited to these substances and values. In this case, the dielectric film 12 formed of silicon oxide film functions as a protective layer covering the laser beam-emitting end face. The laminate constituted by the dielectric film 12 and the light-shielding film 13 formed of titanium and gold functions as an antireflection film for the laser beam produced at the light-emitting region 10. The titanium contained in the light-shielding film 13 is present between the silicon oxide film and the gold and functions to enhance the adhesion between the two. The silicon oxide film, titanium and gold constituting the dielectric film 12 and the light-shielding film 13 are preferably formed by sputtering.

FIG. 3 is a simplified plan view of the semiconductor laser 1 viewed from the side of the laser beam-emitting facet in a state formed with the dielectric film 12 and the light shielding film 13.

As shown in FIG. 3, since substantially the total area of the laser beam-emitting facet of the semiconductor laser 1 is formed with the dielectric film 12 and the light-shielding film 13, the layer structure of the semiconductor laser 1 can no longer be visually ascertained. Nonetheless, owing to the formation of the concavity 11 at a prescribed location of the n-GaAs substrate 2 by the foregoing processes, the laser beam-emitting facet of the semiconductor laser 1 formed with the dielectric film 12 and the light-shielding film 13 has a three-dimensional feature at the portion formed with the concavity 11.

As explained earlier, this kind of three-dimensional feature can be observed by FIB scanning.

Figure 4:
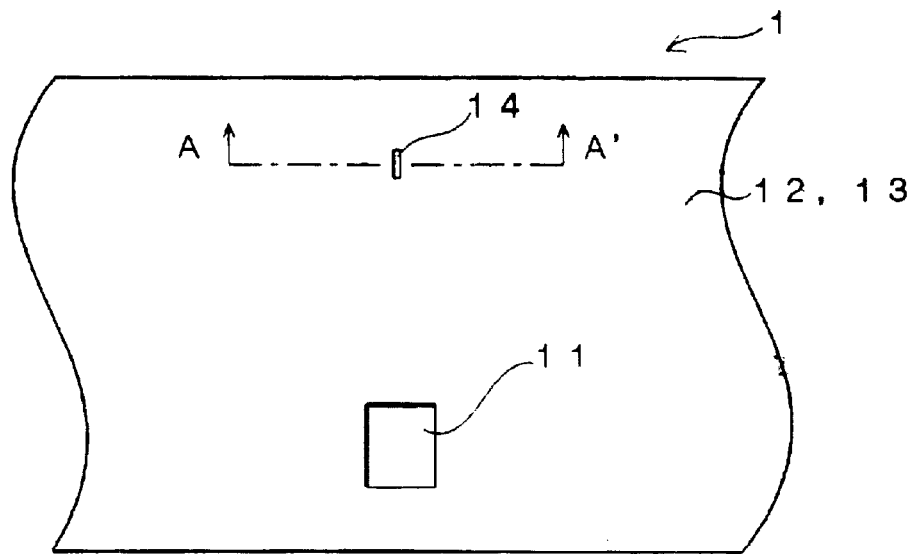
FIG. 4(a) is a simplified plan view of the semiconductor laser 1 viewed from the side of the laser beam-emitting facet in a state formed with a small opening 14.
FIG. 4(b) is a simplified plan view showing an enlargement of an essential portion of FIG. 4(a).
Figure 4:
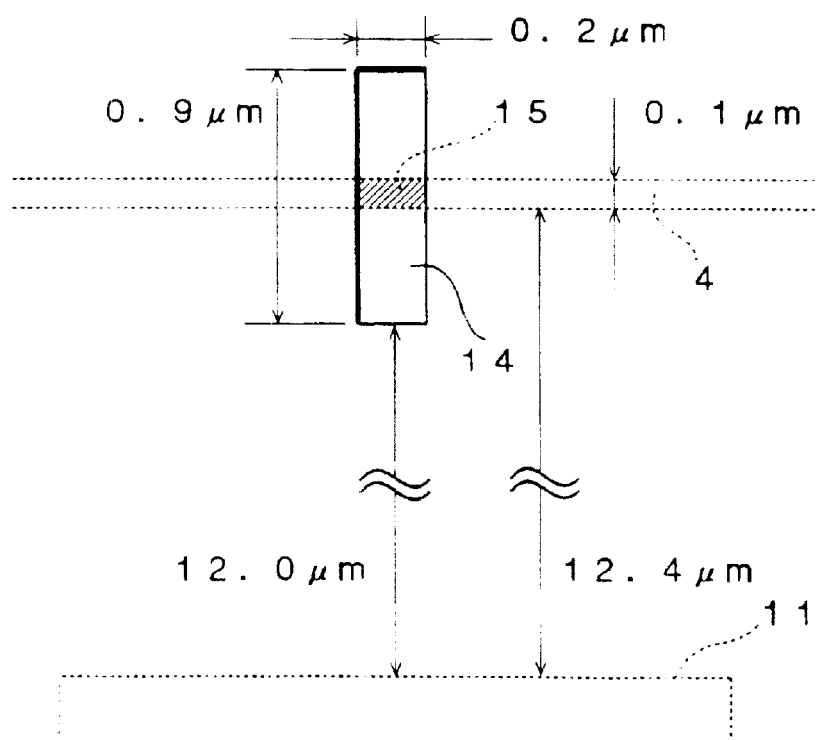

Next, and with reference to FIGS. 4(a) and 4(b), of the entire light-shielding film 13 formed on the laser beam-emitting facet of the semiconductor laser 1 formed with the dielectric film 12 and the light-shielding film 13, the portion formed at the light-emitting region is partially removed to form a small opening 14. In the case where the dielectric film 12 is a silicon oxide film and the light-shielding film 13 is a laminate of titanium and gold, the laminate of titanium and gold is removed at said portion to expose the silicon oxide film.

Figure 5:
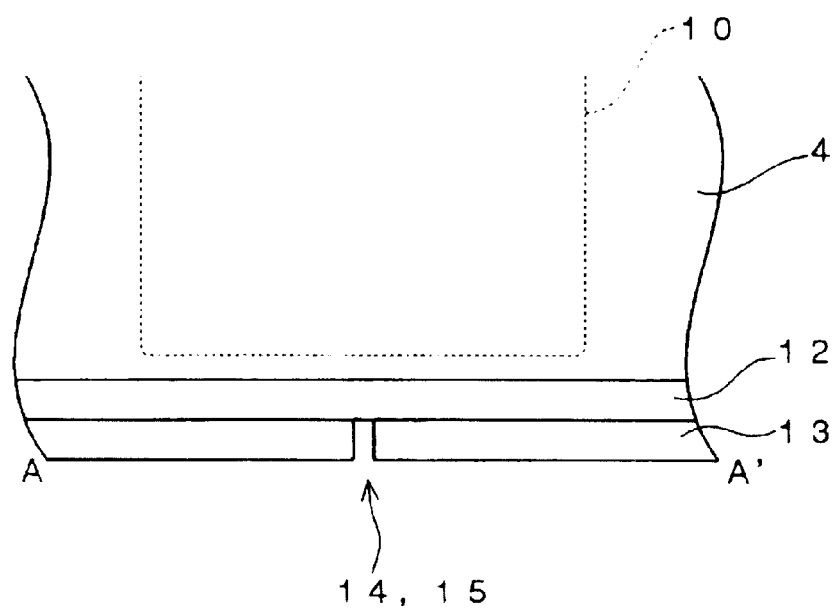
FIG. 5 is a simplified sectional view taken along line A–A' in FIG. 4(a).

FIG. 4(a) is a simplified plan view of the semiconductor laser 1 viewed from the side of the laser beam-emitting facet in a state formed with the small opening 14. FIG. 4(b) is a simplified plan view showing an enlargement of an essential portion of FIG. 4(a). FIG. 5 is a simplified sectional view taken along line A–A' in FIG. 4(a).

As shown in FIGS. 4(a) and 4(b), the small opening 14 is formed as a rectangle measuring about 0.2 μm by 0.9 μm, and its location is determined in relationship to the concavity 11. Specifically, since, as explained in the foregoing, in this embodiment the thickness of the AlGaAs active layer 4 is about 0.1 μm and the distance between the edge of the concavity 11 and the edge of the light-emitting region 10 is about 12.4 μm, the location of the small opening 14 is defined so that the distance between the edge of the small opening 14 and the edge of the concavity 11 becomes about 12.0 μm. Thus, as shown in FIG. 4(b), the AlGaAs active layer 4 forming the light-emitting region 10 is located at substantially the center of the small opening 14 and a portion of the small opening 14 having an area of about 0.1 μm×0.2 μm corresponding to the light-emitting region 10 becomes an evanescent light-emitting portion 15.

As noted above, the small opening 14 is defined to have a length of the 0.9 μm, which is considerably larger than the 0.1 μm thickness of the AlGaAs active layer 4. This is to secure a margin for covering the case where the small opening 14 is formed at a location offset from the prescribed location. The present invention therefore does not particularly limit the length of the longer side of the small opening 14 but leaves it to be set based on the anticipated maximum amount of offset of the small opening 14 at the time of formation. The reason for setting the length of the shorter side of the small opening 14 at 0.2 μm is to shorten the wavelength of the laser beam emitted at the light-emitting region 10. This is because, in order to cause evanescent light emission from the small opening 14, the length of one side of the evanescent light-emitting portion 15 must be made not longer than the wavelength of the laser beam produced at the light-emitting region 10 (780 nm in this embodiment). Since it therefore suffices to set the length of the shorter side of the small opening 14 based on the wavelength of the laser beam emitted at the light-emitting region 10, the invention does not limit this length to the value indicated in the foregoing with respect to this embodiment.

The small opening 14 is formed in the following manner.

Of the entire laser beam-emitting facet of the semiconductor laser 1 in the state shown in FIG. 3, at least the portions at the light-emitting region 10 and the concavity 11 are subjected to FIB irradiation to ascertain the location were the concavity 11 is formed.

Next, a FIB is directed onto a region enclosed by an approximately 0.2 μm×0.9 μm rectangle located apart from the so-ascertained location of the concavity 11 by a predefined distance in a predefined direction. In this embodiment, it is directed onto a prescribed region located approximately 12.0 μm away from the approximate center of the edge of the concavity 11 in the direction of the AlGaAs active layer 4, more specifically onto a region enclosed by an approximately 0.2 μm×0.9 μm rectangle. At this time, the energy density of the FIB is preferably set at about 1–10 pA/μm$^2$, more preferably about 5 pA/μm$^2$. As a result, the portion of the light-shielding film 13 formed on the laser beam-emitting facet of the semiconductor laser 1 irradiated by the FIB is removed to form a small opening 14 as shown in FIG. 5.

The location where the small opening 14 is to be formed can be determined either manually or automatically. The method used can be one of those explained earlier regarding formation of the concavity 11.

The formation of the small opening 14 in the light-shielding film 13 in this manner completes the fabrication of the semiconductor laser 1 of this embodiment.

When a voltage is applied across the negative electrode 8 and the positive electrode 9 to pass electric current from the electrodes into the semiconductor laser 1 fabricated as described above, lasing occurs at the light-emitting region 10 to produce a laser beam having a wavelength of 780 nm. Most of the laser beam impinges on and is absorbed by the dielectric film 12 and the light-shielding film 13 but part of it passes through the dielectric film 12 to reach the evanescent light-emitting portion 15 of the small opening 14 and emerge as evanescent light.

Figure 6:
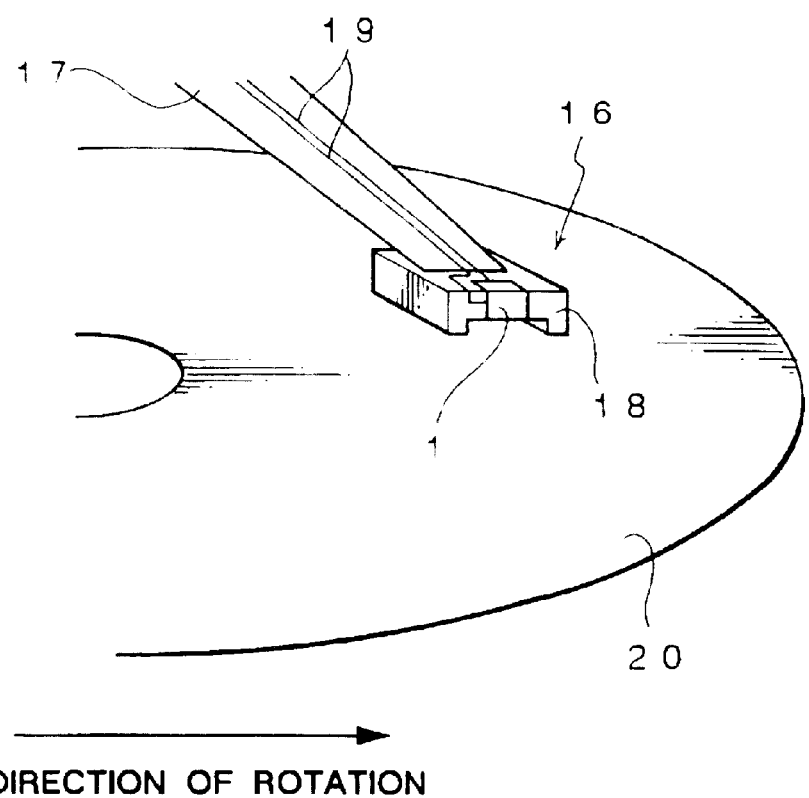
FIG. 6 is a simplified perspective view of an evanescent optical head 16 utilizing the semiconductor laser 1 fabricated the according to the present invention.

FIG. 6 is simplified perspective view of an evanescent optical head 16 utilizing the semiconductor laser 1 fabricated by the method explained in the foregoing.

As shown in FIG. 6, the evanescent optical head 16 comprises a suspension 17, a slider 18 provided at the tip of the suspension 17 and the semiconductor laser 1 mounted in the slider 18. The negative electrode 8 and positive electrode 9 (neither shown) of the semiconductor laser 1 are supplied with a prescribed amount of current through wires 19. The evanescent optical head 16 configured in this manner directs an evanescent beam onto a rotating disk 20 to write desired data to the disk and read data previously written to the disk 20.

The type of the disk 20 is not particularly limited insofar as it uses light to read and/or write data. It can, for example, be a phase-change disk or a magneto-optical disk.

In the foregoing embodiments, since the concavity 11 is formed in the n-GaAs substrate 2 to have a prescribed positional relationship with the light-emitting region 10, the location at which the small opening 14 should be formed can be visually determined even after the laser beam-emitting facet is covered with the dielectric film 12 and the light-shielding film 13. The location at which the small opening 14 should be formed can therefore be determined more accurately and more easily than by the conventional method utilizing the shape of the semiconductor laser as a reference.

Moreover, since the concavity 11 is formed using the same FIB processing as is used to form the small opening 14, no special equipment is required for applying this embodiment. The cost of producing the semiconductor laser 1 is therefore not substantially increased.

Further, in the foregoing embodiments, since the location of the light-emitting region 10 is ascertained by scanning at least the light-emitting region 10 of the laser beam-emitting facet of the semiconductor laser 1 with a FIB (first FIB irradiation), the oxide film that unavoidably forms on the surface of the light-emitting region 10 and the impurities that adhere to the light-emitting region 10 between the time that the semiconductor laser 1 is cut from a wafer and the time that the dielectric film 12 and the light-shielding film 13 are formed, are removed by the FIB irradiation. This is advantageous insofar as degradation of the performance of the semiconductor laser 1 owing to the presence of an oxide film and impurities on the light-emitting region 10 can be prevented.

While in the foregoing embodiments the concavity 11 serving as a marker indicating the location of the light-emitting region 10 is formed on the n-GaAs substrate 2, the location at which the concavity 11 is formed is not limited to n-GaAs substrate 2.

Figure 7:
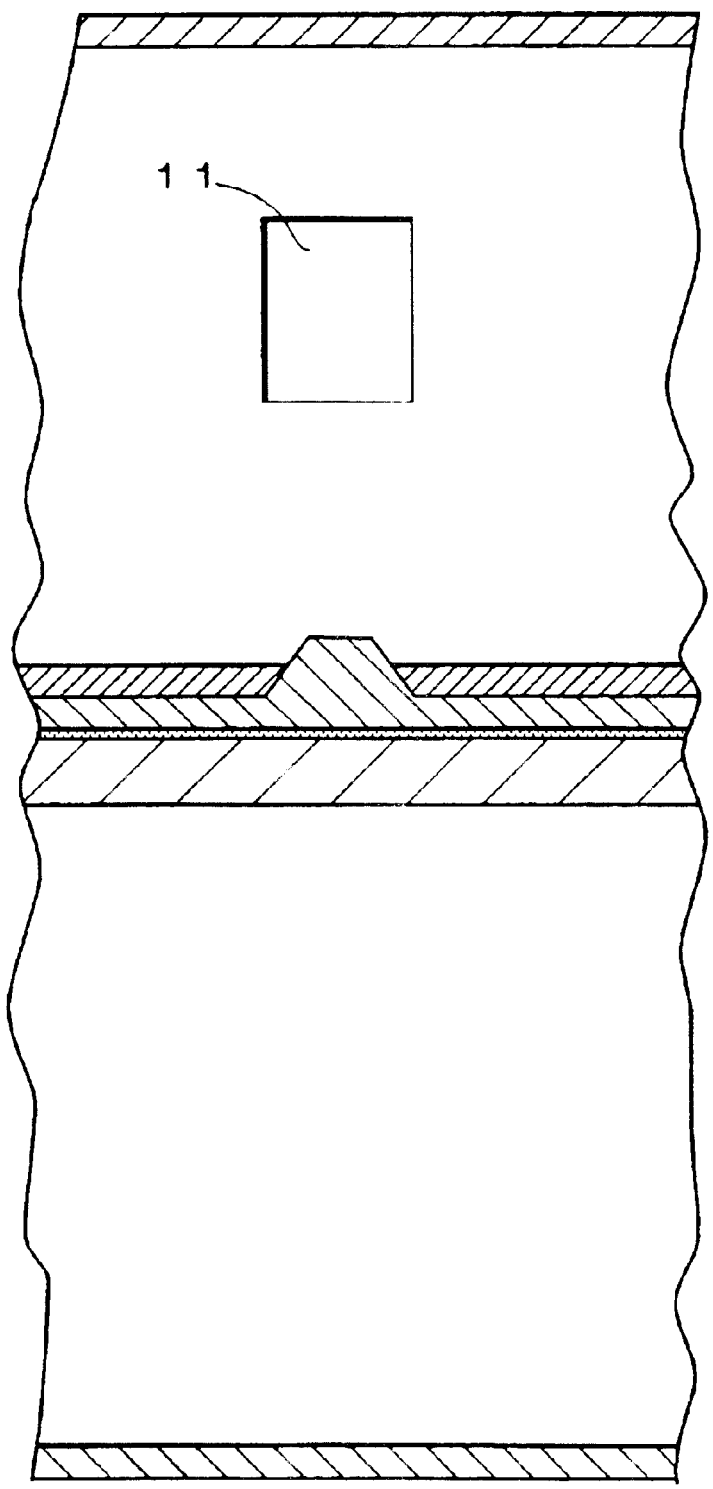
FIG. 7 shows an example in which the concavity 11 is formed in a p-GaAs contact layer 7.
Figure 8:
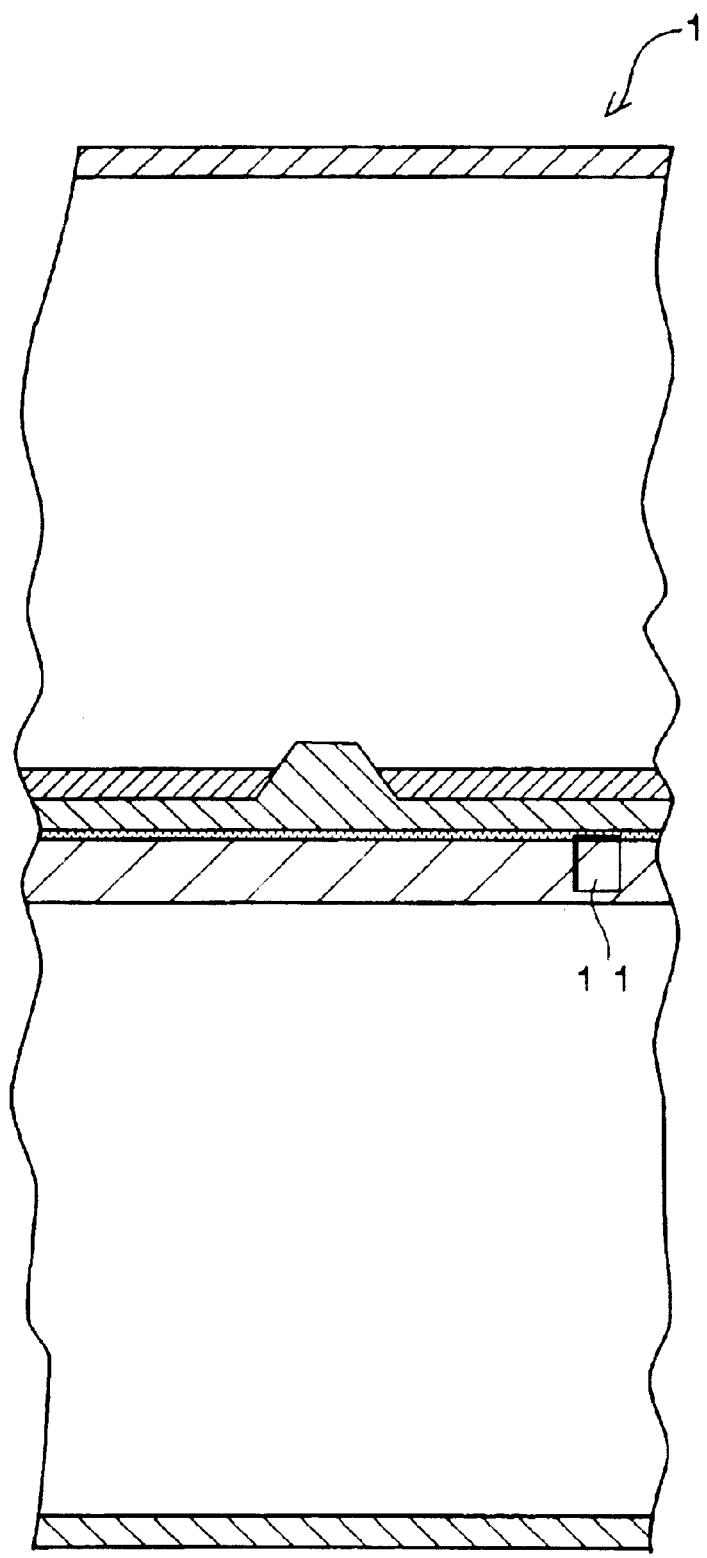
FIG. 8 shows an example in which the concavity 11 is formed in an n-AlGaAs clad layer 3 and an AlGaAs active layer 4.

FIG. 7 shows an example in which the concavity 11 is formed in the p-GaAs contact layer 7. FIG. 8 shows an example in which the concavity 11 is formed in the n-AlGaAs clad layer 3 and the AlGaAs active layer 4.

While, as shown in FIGS. 7 and 8, alternative locations for forming the concavity 11 include the p-GaAs contact layer 7 and the AlGaAs active layer 4, other locations are also possible. In a word, any location on the laser beam-emitting facet of the semiconductor laser 1 other than the light-emitting region 10 can be utilized for forming the concavity 11.

From the viewpoint of accurately determining the location at which the small opening 14 should be formed, however, it is better to form the concavity 11 at a location near the light-emitting region 10 than to form it at a location far from the light-emitting region 10. When the concavity 11 is formed too close to the light-emitting region 10, though, the light-emitting region 10 is liable to be contaminated by readherence of discharged atoms owing to the surface atom sputtering phenomenon produced by FIB irradiation. The distance between the light-emitting region 10 and the concavity 11 should therefore be determined taking these considerations into account. When the distance between the light-emitting region 10 and the concavity 11 is set at about 12.4 μm as in the embodiment set out above, the location at which the small opening 14 should be formed can be determined with fairly good accuracy while also avoiding contamination of the light-emitting region 10 by secondary electrons.

While in the foregoing embodiments a single concavity 11 is formed in the n-GaAs substrate 2 to serve as a marker indicating the location of the light-emitting region 10, the number of concavities 11 is not limited to one.

Figure 9:
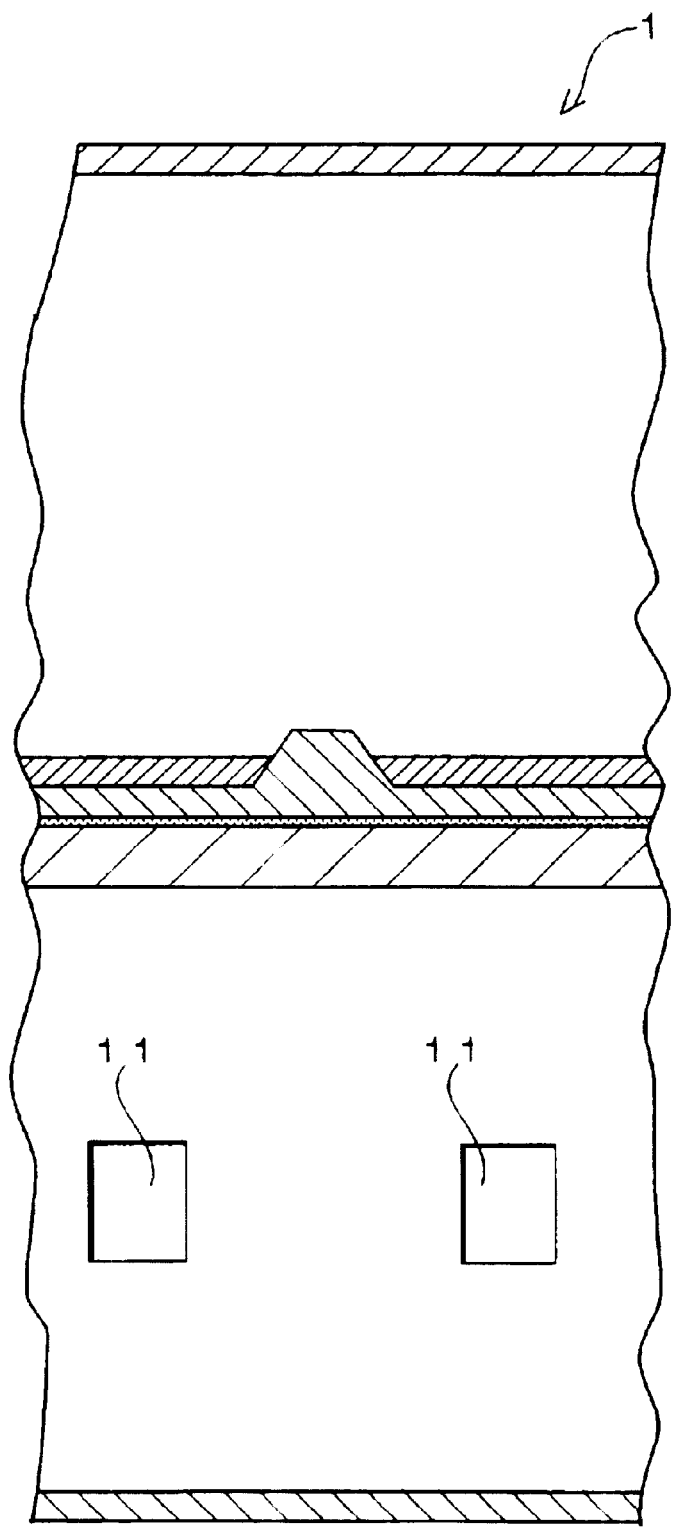
FIG. 9 shows an example in which two concavities 11 are formed in the n-GaAs substrate 2.
Figure 10:
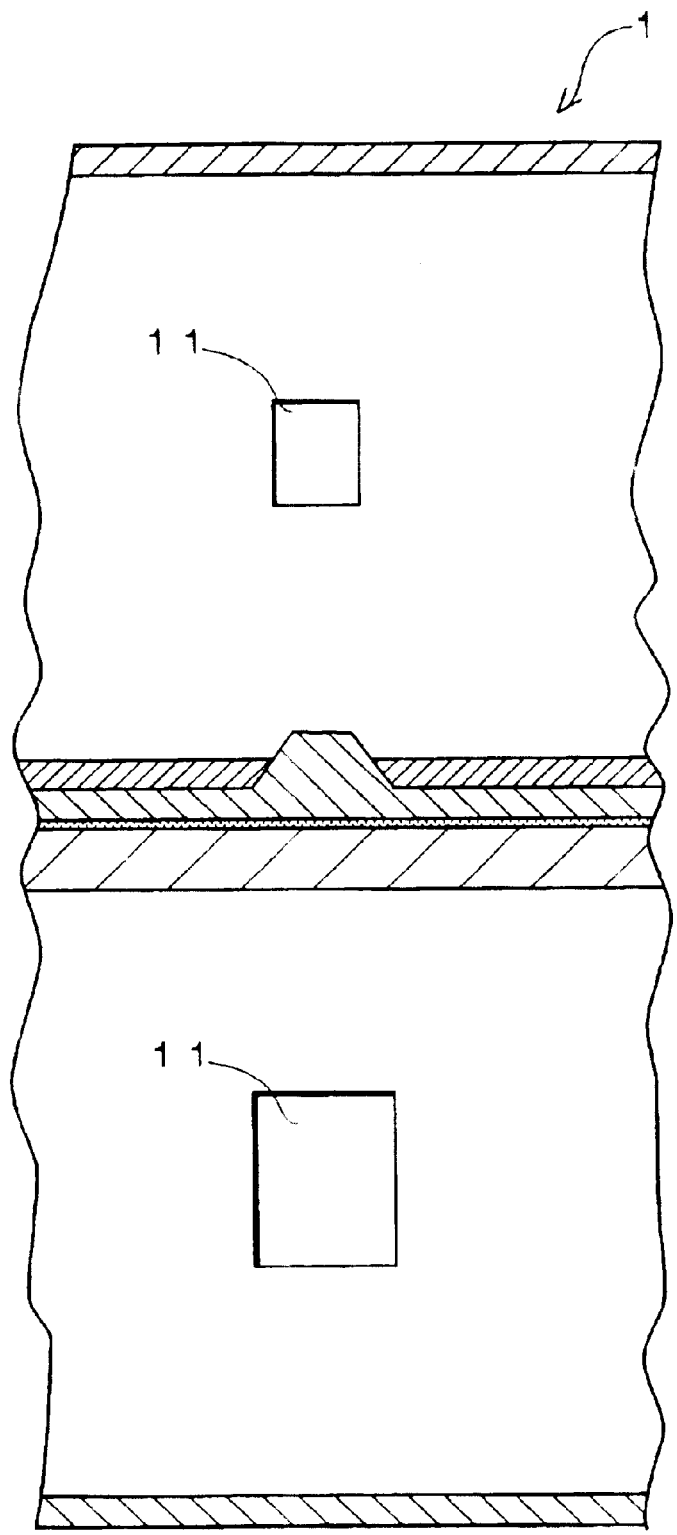
FIG. 10 shows an example in which concavities 11 are formed in the n-GaAs substrate 2 and p-GaAs contact layer 7.

FIG. 9 shows an example in which two concavities 11 are formed in the n-GaAs substrate 2. FIG. 10 shows an example in which concavities 11 are formed in the n-GaAs substrate 2 and the p-GaAs contact layer 7.

While FIGS. 9 and 10 show that the number of concavities 11 can be two, a larger number is also possible. When multiple concavities 11 are formed, their sizes may be the same, as shown in FIG. 9, or different, as shown in FIG. 10.

While in foregoing embodiments the concavity 11 formed to serve as a marker indicating the location of the light-emitting region 10 is rectangular, the shape of the concavity 11 is not limited to rectangular.

Figure 11:
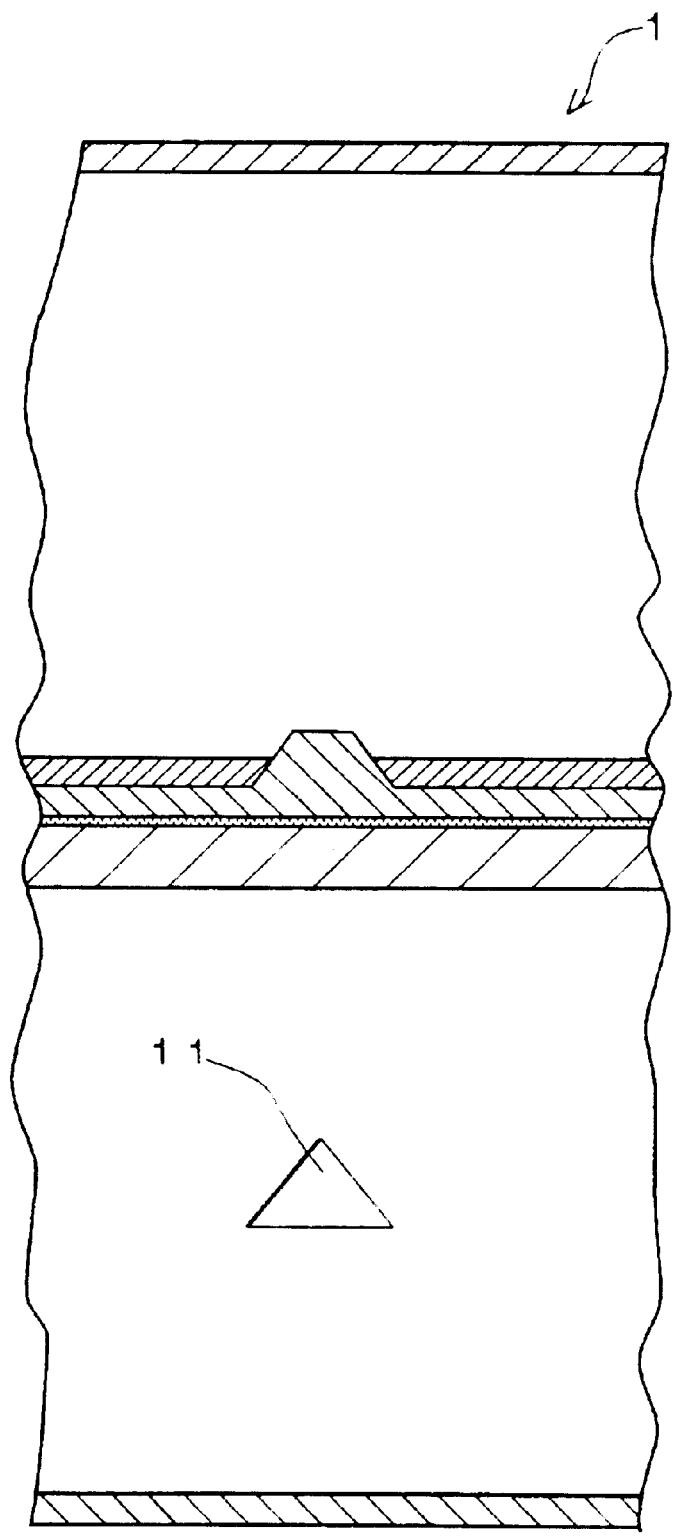
FIG. 11 shows an example in which the shape of the concavity 11 is triangular.
Figure 12:
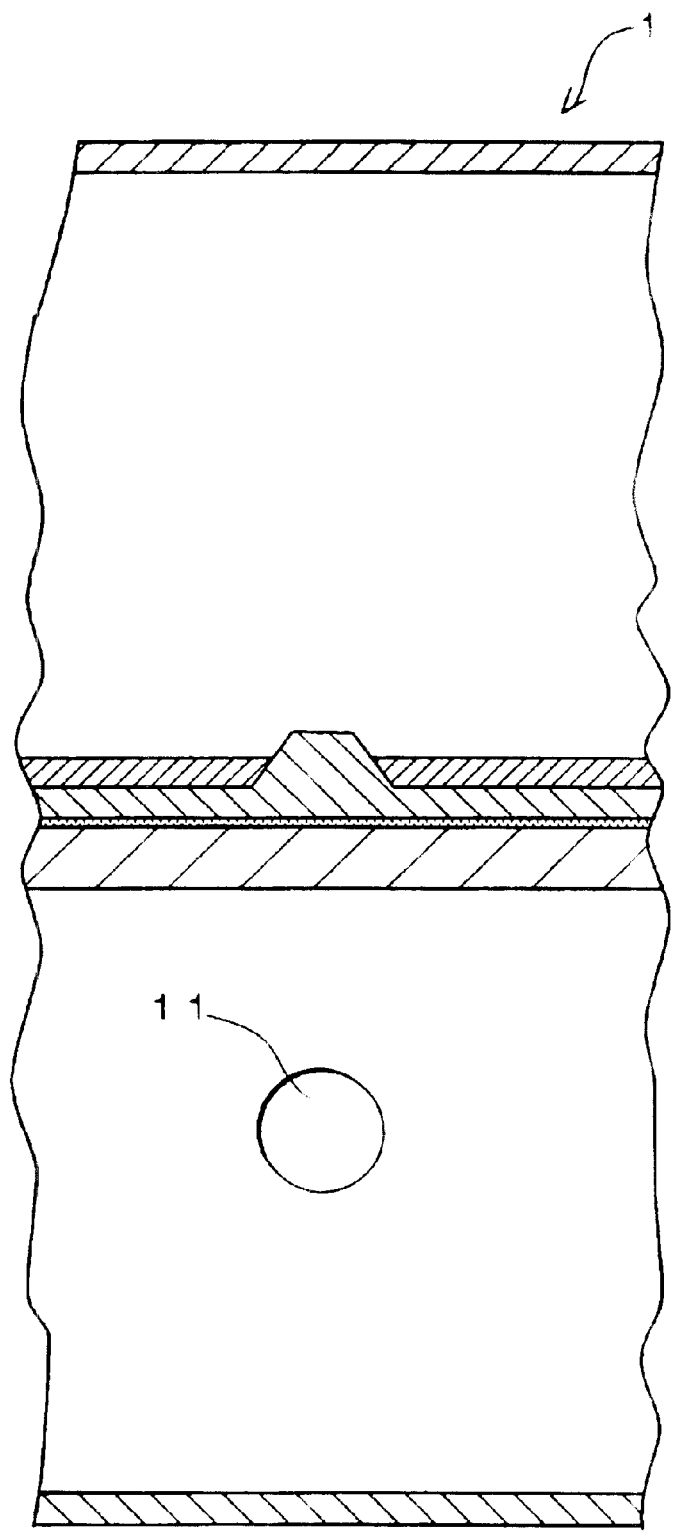
FIG. 12 shows an example in which the shape of the concavity 11 is circular.

FIG. 11 shows an example in which the shape of the concavity 11 is triangular. FIG. 12 shows an example in which the shape of the concavity 11 is circular.

While FIGS. 11 and 12 show that the shape of the concavity 11 can be triangular or circular, other shapes are also possible, including, for example, square, hexagonal, rhombic, elliptical, T-shaped and L-shaped. In other words, the concavity 11 can be of any shape.

While in the foregoing embodiments the marker for indicating the location of the light-emitting region 10 is a concavity 11 formed in the n-GaAs substrate 2, the marker for indicating the location of the light-emitting region 10 is not limited to a concavity.

Figure 13:
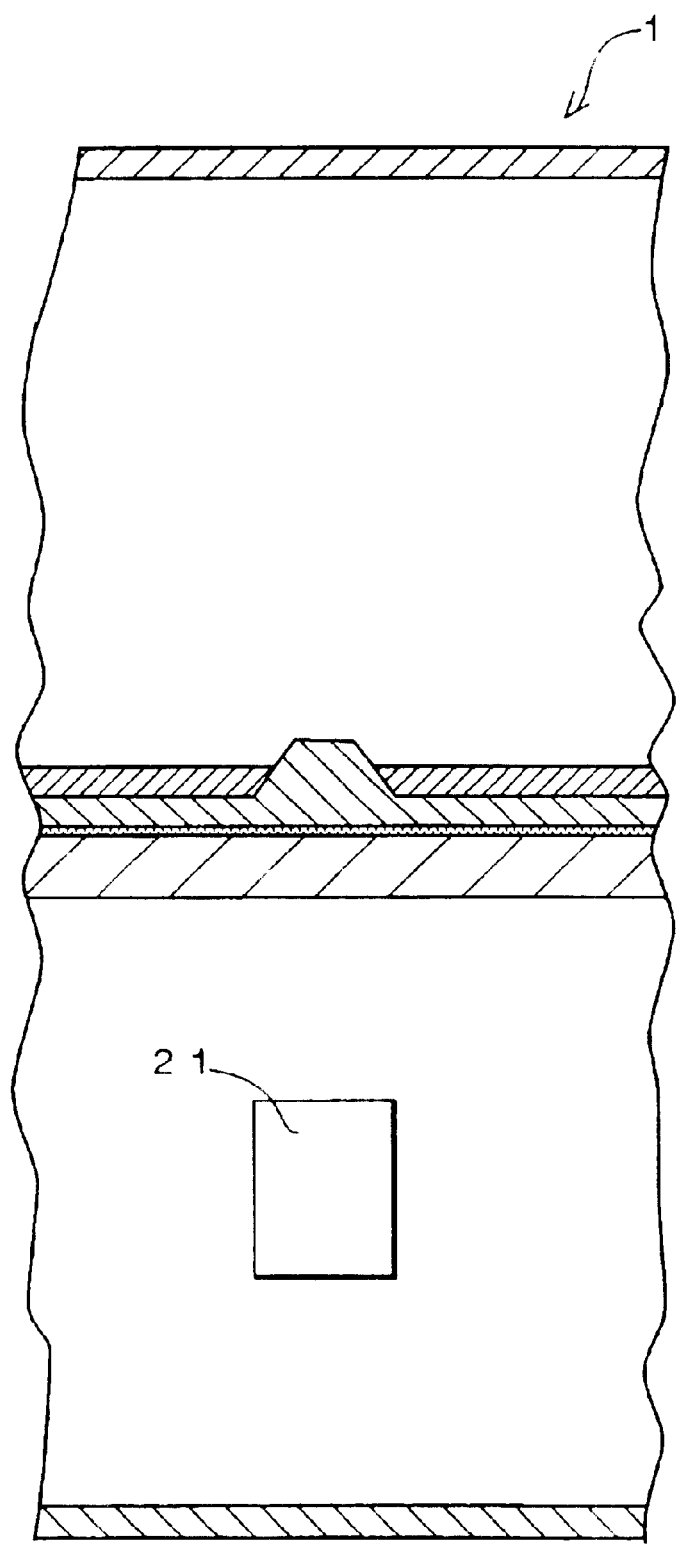
FIG. 13 shows an example in which a convexity 21 is formed in the n-GaAs substrate 2 as a marker indicating the location of a light-emitting region 10.

FIG. 13 shows an example in which a convexity 21 is formed in the n-GaAs substrate 2 as a marker indicating the location of a light-emitting region 10.

As shown in FIG. 13, the convexity 21 can be used in place of the concavity 11 as a marker indicating the location of a light-emitting region 10. In other words, the marker can be of any type insofar as it constitutes a three-dimensional feature that is reflected in the surface of the dielectric film 12 and the light-shielding film 13 after the laser beam-emitting facet has been covered thereby.

The convexity 21 can be formed on the laser beam-emitting facet of the semiconductor laser 1 by irradiating the region where the convexity 21 is to be formed with a FIB while simultaneously supplying raw material gas to the laser beam-emitting facet of the semiconductor laser 1. By this, the raw material gas irradiated by the FIB is decomposed and the decomposition products of the raw material gas deposit on the irradiated region to form the convexity 21 at the FIB-irradiated region. The raw material gas can, for example, be tungsten hexacarbonyl, in which case the convexity 21 can be formed of tungsten.

The present invention has thus been shown and described with reference to specific embodiments. However, it should be noted that the present invention is in no way limited to the details of the described arrangements but changes and modifications may be made without departing from the scope of the appended claims.

For example, while an FIB is used as the means for forming the concavity 11 in the foregoing embodiments, the concavity 11 can instead be formed by another means. Likewise, while an FIB is used as the means for forming the small opening 14 in the foregoing embodiments, the small opening 14 can instead be formed by another means. It is worth noting, however, that use of the same means for forming the concavity 11 and the small opening 14 is effective for holding down the cost of producing the semiconductor laser 1.

Further, the present invention is not limited to application to a semiconductor laser having the layer structure of the semiconductor laser 1 described in the foregoing embodiments, but also can be applied to a semiconductor laser having a different layer structure.

Moreover, although the foregoing embodiments specify the depth of the concavity 11 as about 1 μm, the concavity 11 can be of any depth insofar as its shape is reflected and its location can be ascertained even after formation of the dielectric film 12 and the light-shielding film 13. The same principle also applies to the convexity 21.

In addition, although the foregoing embodiments specify that the width of the light-emitting region 10 and the width of the concavity 11 substantially coincide, and that the locations of the light-emitting region 10 and the concavity 11 coincide in the lateral direction, this is only for ensuring that the portion of the AlGaAs active layer 4 corresponding to the width of the concavity 11 is the light-emitting region 10, and such coincidence is not absolutely necessary.

As explained in the foregoing, since the invention forms a three-dimensional feature on the light-emitting region of a semiconductor laser so as to have a prescribed positional relationship with the light-emitting region, it can provide a semiconductor laser that can be easily formed with a small opening for emitting evanescent light, a method of producing the semiconductor laser and an evanescent optical head utilizing the semiconductor laser.

What is claimed is:

1. A semiconductor laser having a laser beam-emitting facet, the semiconductor laser comprising:

a light-emitting region formed on the laser beam-emitting facet;

an indicator region spaced at a distance from the light-emitting region; and a three dimensional marker indicating the location of the light-emitting region, wherein the three dimensional marker is located in the indicator region, and wherein the three-dimensional marker is at least one of a concavity and a convexity formed on the laser beam-emitting facet in the indicator region.

2. The semiconductor laser as claimed in claim 1, further comprising a light-shielding film covering at least the light-emitting region, the light shielding film having a small opening in part of the portion of the light shielding film covering the light-emitting region.

3. The semiconductor laser as claimed in claim 2, wherein the light-shielding film further covers the three-dimensional marker.

4. The semiconductor laser as claimed in claim 2, further comprising a dielectric film provided between the laser beam-emitting facet and the light-shielding film, wherein part of the dielectric film is exposed at the small opening.

5. A method of producing a semiconductor laser having a laser beam-emitting facet including a light-emitting region, the method comprising:

forming an indicator region at a location on the laser beam-emitting region, the indicator region having a three dimensional marker located thereon, and wherein the three-dimensional marker is at least on of a concavity and a convexity formed on the laser beam-emitting facet in the indicator region;

forming a light-shielding film covering at least the light-emitting region; and forming the light-shielding film within a small opening at a location having a prescribed positional relationship with the three-dimensional marker.

6. The method as claimed in claim 5, wherein the forming of the indicator region and the forming of the small opening both utilize focused ion beam processing.

7. The method as claimed in claim 5, further comprising: irradiating at least the light-emitting region of the laser beam-emitting facet with a focused ion beam before forming of the indicator portion.

8. The method as claimed in claim 5, further comprising: irradiating at least the light emitting region of the laser beam-emitting facet with a focused ion beam before the forming of the indicator portion.

9. A semiconductor laser assembly including a semiconductor laser having a laser beam-emitting facet comprising:

a light-emitting region formed on the laser beam-emitting facet;

an indicator region spaced at a distance from the light-emitting region; and a three dimensional marker indicating the location of the light emitting region, wherein the three dimensional marker is located in the indicator region, and wherein the three-dimensional marker is at least one of a concavity and a convexity formed on the laser beam-emitting facet in the indicator region.

10. The semiconductor laser assembly as claimed in claim 9, further comprising a light-shielding film covering at least the light-emitting region, the light shielding film being formed with a small opening at part of the portion of the light shielding film covering the light-emitting region.

11. The semiconductor laser assembly as claimed in claim 10, wherein the light-shielding film further covers the three-dimensional marker.

12. The semiconductor laser assembly as claimed in claim 10, further comprising a dielectric film provided between the laser beam-emitting facet and the light-shielding film, part of the dielectric film being exposed at the small opening.

* * * * *

UNITED STATES PATENT AND TRADEMARK OFFICE
CERTIFICATE OF CORRECTION

PATENT NO. : 6,792,022 B2
APPLICATION NO. : 10/039490
DATED : September 14, 2004
INVENTOR(S) : Makoto Takahashi It is certified that error appears in the above-identified patent and that said Letters Patent is hereby corrected as shown below:

Page One, Item (57) under Abstract, line 4, after the word, "beam-emitting", delete the word, "end."

Column 1
Line 45, delete the word, "end"
Line 45, change the word "face" to --facet--
Line 56, after the word, "light-emitting," delete the word "end"
Line 56, change the word, "face" to --facet--
Line 62, after the word "emitting," delete the word "end."
Line 62, change the word "face" to --facet--
Line 66, after the word "light-emitting," delete the word "end"
Line 66, change the word "face" to --facet--.

Column 2
Line 5, after the word, "light-emitting" delete the word "end"
Line 6, change the word "face" to --facet--
Line 27, after the word "beam-emitting" delete the word"end"

Column 5
Line 7, after the word "concavity" change the number "1" to --11--

Column 6
Line 22, after the word "beam-emitting" delete the word "end"
Line 22, change the word "face" to --facet--

Column 11
Line 12, after the word "beam-emitting" insert --facet that has a prescribed positional relationship with the light-emitting--
Line 14, change the word "on" to --one--
Line 28, change the word "portion" to --region--

UNITED STATES PATENT AND TRADEMARK OFFICE
CERTIFICATE OF CORRECTION

PATENT NO. : 6,792,022 B2
APPLICATION NO. : 10/039490
DATED : September 14, 2004
INVENTOR(S) : Makoto Takahashi It is certified that error appears in the above-identified patent and that said Letters Patent is hereby corrected as shown below:

Column 12
Line 2, change the word "portion" to --region--

Signed and Sealed this

Twenty-fourth Day of October, 2006

JON W. DUDAS
*Director of the United States Patent and Trademark Office*